(12) United States Patent
Oh et al.

(10) Patent No.: US 7,940,877 B1
(45) Date of Patent: May 10, 2011

(54) SIGNAL EDGE DETECTION CIRCUITRY AND METHODS

(75) Inventors: John Oh, San Jose, CA (US); Samson Tam, San Francisco, CA (US); Curt Wortman, Ottawa (CA); Jean Luc Berube, Hull (CA)

(73) Assignee: Altera Corporation, San Jose, CA (US)

( * ) Notice: Subject to any disclaimer, the term of this patent is extended or adjusted under 35 U.S.C. 154(b) by 1735 days.

(21) Appl. No.: 10/819,556

(22) Filed: Apr. 6, 2004

Related U.S. Application Data

(63) Continuation-in-part of application No. 10/722,665, filed on Nov. 26, 2003, now Pat. No. 7,295,641.

(51) Int. Cl.
*H04L 25/40* (2006.01)
*H04L 7/00* (2006.01)

(52) U.S. Cl. .................................... 375/371; 375/362

(58) Field of Classification Search .................. 375/371, 375/373, 372, 360, 264, 361, 376, 226
See application file for complete search history.

(56) References Cited

U.S. PATENT DOCUMENTS

| | | | |
|---|---|---|---|
| 5,459,753 A | 10/1995 | Co et al. | |
| 5,485,490 A | 1/1996 | Leung et al. | |
| 5,533,072 A | 7/1996 | Georgiou et al. | |
| 5,533,073 A | 7/1996 | Eriksson | |
| 5,535,252 A | 7/1996 | Kobayashi | |
| 5,673,295 A | 9/1997 | Read et al. | |
| 5,696,800 A * | 12/1997 | Berger | 375/361 |
| 5,745,530 A * | 4/1998 | Baek et al. | 375/342 |
| 6,222,380 B1 * | 4/2001 | Gerowitz et al. | 326/38 |
| 6,288,656 B1 | 9/2001 | Desai | |
| 6,304,623 B1 | 10/2001 | Richards et al. | |
| 6,307,869 B1 | 10/2001 | Pawelski | |
| 6,347,128 B1 | 2/2002 | Ransijn | |
| 6,359,946 B1 * | 3/2002 | Ryan | 375/371 |
| 6,363,129 B1 | 3/2002 | Agazzi | |
| 6,650,140 B2 | 11/2003 | Lee et al. | 326/39 |
| 7,031,420 B1 | 4/2006 | Jenkins et al. | |
| 7,167,534 B2 * | 1/2007 | Nakamura | 375/373 |
| 7,180,966 B2 * | 2/2007 | Vallet et al. | 375/340 |
| 7,221,725 B2 * | 5/2007 | Tinker | 375/355 |
| 2001/0033188 A1 | 10/2001 | Aung et al. | 327/141 |
| 2005/0207520 A1 * | 9/2005 | Su et al. | 375/355 |
| 2006/0233291 A1 * | 10/2006 | Garlepp et al. | 375/355 |

OTHER PUBLICATIONS

U.S. Appl. No. 10/059,014, filed Jan. 29, 2002, Lee et al.
U.S. Appl. No. 10/349,541, filed Jan. 21, 2003, Venkata et al.
U.S. Appl. No. 10/672,901, filed Sep. 26, 2003, Asaduzzaman et al.

(Continued)

*Primary Examiner* — Chieh M Fan
*Assistant Examiner* — Qutbuddin Ghulamali
(74) *Attorney, Agent, or Firm* — Ropes & Gray LLP

(57) ABSTRACT

Double data rate ("DDR") circuitry or the like is modified or enhanced to include edge detection capability. During edge detection mode the circuitry is supplied with serial training data that includes successive pairs of equal-valued bits. Several, differently-phased, candidate clock signals are used one after another in order of increasing phase to clock the DDR circuitry. Adjacent bits in the training data that should be equal-valued are captured by the DDR circuitry and compared. Any candidate clock signal that causes the bits thus compared to be unequal is flagged as having phase close to edges in the data. The approximate phase of data edges is thereby indicated by the phase (or phases) of the candidate clock signal (or signals) causing the bits compared as described above to be unequal.

17 Claims, 7 Drawing Sheets

OTHER PUBLICATIONS

U.S. Appl. No. 10/713,877, filed Nov. 13, 2003, Churchill et al.
U.S. Appl. No. 10/470,120, filed Dec. 17, 2003, Wang et al.
U.S. Appl. No. 10/739,445, filed Dec. 17, 2003, Wang et al.
U.S. Appl. No. 10/722,665, filed Mar. 16, 2004, Wortman et al.

* cited by examiner

| CANDIDATE CLOCK SIGNAL NO. | COMPARE 1 |
|---|---|
| 1 | NO |
| 2 | NO |
| 3 | NO |
| 4 | YES |
| 5 | NO |
| 6 | NO |
| 7 | NO |
| 8 | NO |
| 9 | NO |
| 10 | NO |
| 11 | NO |
| 12 | YES |
| 13 | NO |
| 14 | NO |
| 15 | NO |
| 16 | NO |

SIGNAL EDGE DETECTION CIRCUITRY AND METHODS

This is a continuation-in-part of U.S. patent application Ser. No. 10/722,665, filed Nov. 26, 2003, which is hereby incorporated by reference herein in its entirety.

BACKGROUND OF THE INVENTION

This invention relates to circuitry and methods for detecting transitions or edges in a time-varying signal such as a serial data signal. Such edge detection may also be referred to as determining the phase of the time-varying signal (or the phase of the edges in that signal). Edge detection may be used to determine where the edge-detected signal can best be sampled to reliably recover data from that signal (e.g., by avoiding sampling in the vicinity of edges where the signal may be changing in level and therefore not stable enough for reliable sampling).

Prior Wortman et al. U.S. patent application Ser. No. 10/722,665, filed Nov. 26, 2003 (which is hereby incorporated by reference herein in its entirety) shows circuitry for determining the phase of a serial data signal so that an advantageous phase selection can be made for the clock signal that will be used to sample that signal for data recovery. The circuitry in the above-mentioned application employs circuitry for storing and recirculating data bits of a training pattern. There may be some applications in which it is desirable to avoid a need for such training-pattern-handling circuitry.

SUMMARY OF THE INVENTION

In accordance with the present invention, the phase of transitions in a time-varying signal (generally referred to for convenience herein as a serial data signal) can be detected by using a clock signal to time the taking of samples of the data signal at the rate of data bits in the data signal. The phase of the clock signal is periodically changed so that a plurality of different clock signal phases are used one after another. Any phase of the clock signal that causes successive data signal samples to have a relationship to one another that is not as expected for samples of two successive bits in the data signal is identified as being a phase that is at or near the phase of the data signal. If it is desired to select a clock signal phase that will be advantageous for subsequent sampling of the data signal to recover data from it, that can be a phase that was not identified as described in the preceding sentence, but that is between phases that were identified as described in the preceding sentence.

Double data rate ("DDR") circuitry refers to circuitry for handling a data signal having a data bit rate that is twice the frequency of a clock signal used in that circuitry. The present invention is not limited to use in or with DDR circuitry, but DDR circuitry can be a convenient context in which to implement the invention. Thus circuitry in accordance with the invention for detecting phase of edges in a serial data signal may include DDR circuitry for normally capturing samples of two successive bits in each of a plurality of successive pairs of bits in the data signal. The DDR circuitry operates to capture the samples in synchronism with a clock signal. The circuitry may further include circuitry for causing the clock signal to have changing phase. And the circuitry may still further include circuitry for detecting any phase of the clock signal that causes two successive samples captured by the DDR circuitry to not have a normal relationship to one another (i.e., the relationship expected for the two bits in one of the bit pairs in the data signal).

Further features of the invention, its nature and various advantages will be more apparent from the accompanying drawings and the following detailed description.

BRIEF DESCRIPTION OF THE DRAWINGS

FIG. 6 is a simplified table of some illustrative data that may be collected in accordance with the invention.

DETAILED DESCRIPTION

Figure 1:
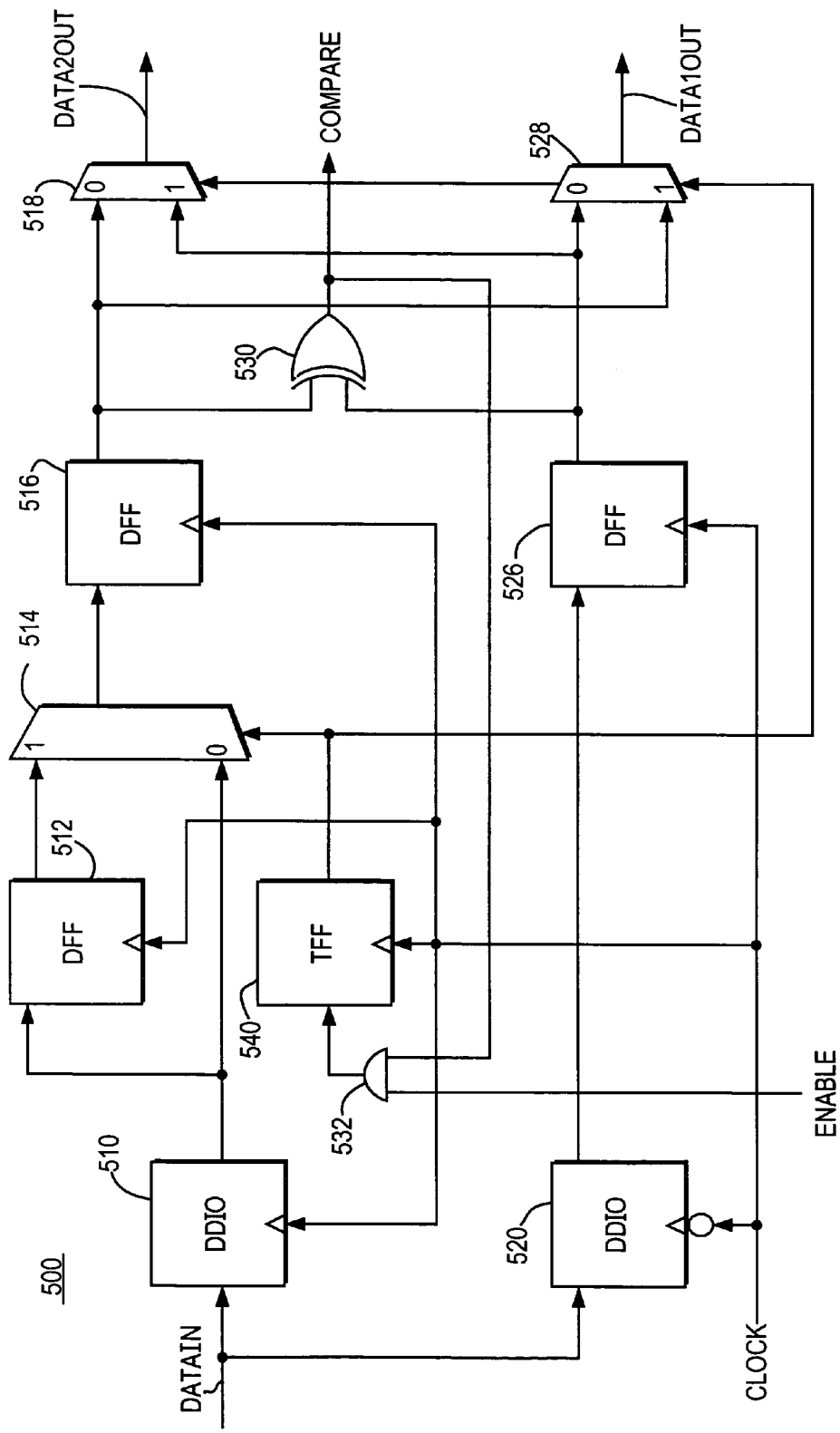
FIG. 1 is a simplified schematic block diagram of an illustrative embodiment of circuitry in accordance with the invention.

An illustrative embodiment of edge detection circuitry 500 in accordance with this invention is shown in FIG. 1. The DATAIN signal in this embodiment includes training data that is supplied wherever edge detection is to be performed. In the illustrative embodiment on which the most time will be spent in this detailed description, this training data includes an even number of binary is alternating with an even number of binary 0s. For example, this training data can be ten 1s followed by ten 0s followed by ten 1s, etc. The numbers of 1s and 0s in each group do not have to be the same for both 1s and 0s, nor do these numbers have to be constant over time.

The CLOCK signal in FIG. 1 has a frequency that is half the data or bit rate of the DATAIN signal. In other words, there are two successive unit intervals ("UIs") in the DATAIN signal in the time required to complete one cycle of the CLOCK signal. Thus the circuitry is of the type sometimes known as double data rate ("DDR") circuitry.

Initially there is no particular or necessary phase relationship or alignment between DATAIN and CLOCK, and indeed during any training period of operation of the circuitry the phase of CLOCK changes over time in accordance with this invention. An object of the invention is to use CLOCK with progressively different phases to detect edges (transitions) in DATAIN, and thereafter to select a final phase for CLOCK that will avoid sampling DATAIN too close to its transitions (e.g., preferably near the center of UIs in DATAIN).

DATAIN is applied to DDIO flip-flops 510 and 520. Flip-flop 510 is clocked by CLOCK. Flip-flop 510 therefore samples DATAIN at each rising edge in CLOCK. Flip-flop 520 is clocked by the inverse of CLOCK. Flip-flop 520 therefore samples DATAIN at each falling edge in CLOCK. Because the bit rate of DATAIN is twice the CLOCK rate, flip-flops 510 and 520 collectively act to demultiplex successive pairs of bits in DATAIN. For example, if successive bits in DATAIN are identified as A, B, C, D, E, F, etc., with the successive bit pairs being A/B, C/D, E/F, etc., the output of flip-flop 520 may be A, C, E, etc., and the output of flip-flop 510 may be B, D, F, etc.

The output signal of flip-flop 510 is applied to D flip-flop 512 and to one input terminal of multiplexer 514 (in particular the input of multiplexer 514 that is selected when the output signal of T flip-flop 540 is 0). Flip-flop 512 is also clocked by CLOCK. The output signal of flip-flop 512 is applied to the other input terminal of multiplexer 514 (i.e., the input that is selected when the output of flip-flop 540 is 1). The output signal of multiplexer 514 is applied to D flip-flop 516 (also clocked by CLOCK). The output signal of flip-flop 516 is applied to one input terminal of multiplexer 518, and also to one input terminal of EXCLUSIVE OR ("XOR") gate 530. The multiplexer 518 input terminal just mentioned is the one selected when the output signal of flip-flop 540 is 0. A further destination of the output signal of flip-flop 516 is one input terminal of multiplexer 528 (i.e., the input terminal of that multiplexer that is selected when the output signal of flip-flop 540 is 1).

The output signal of flip-flop 520 is applied to D flip-flop 526, also clocked by CLOCK. The output signal of flip-flop 526 is applied to one input terminal of multiplexer 528, and also to the second input terminal of XOR gate 530. The multiplexer 528 input terminal just mentioned is the one selected when the output signal of flip-flop 540 is 0. A further destination of the output signal of flip-flop 526 is the input of multiplexer 518 that is selected when the output signal of flip-flop 540 is 1.

The output signal of XOR gate 530 is the data input to flip-flop 540 (when AND gate 532 is enabled by the ENABLE signal). Flip-flop 540 is a toggle-type flip-flop. Accordingly, flip-flop 540 changes state in response to each CLOCK signal rising edge if and only if its data input is then 1.

Figure 2:
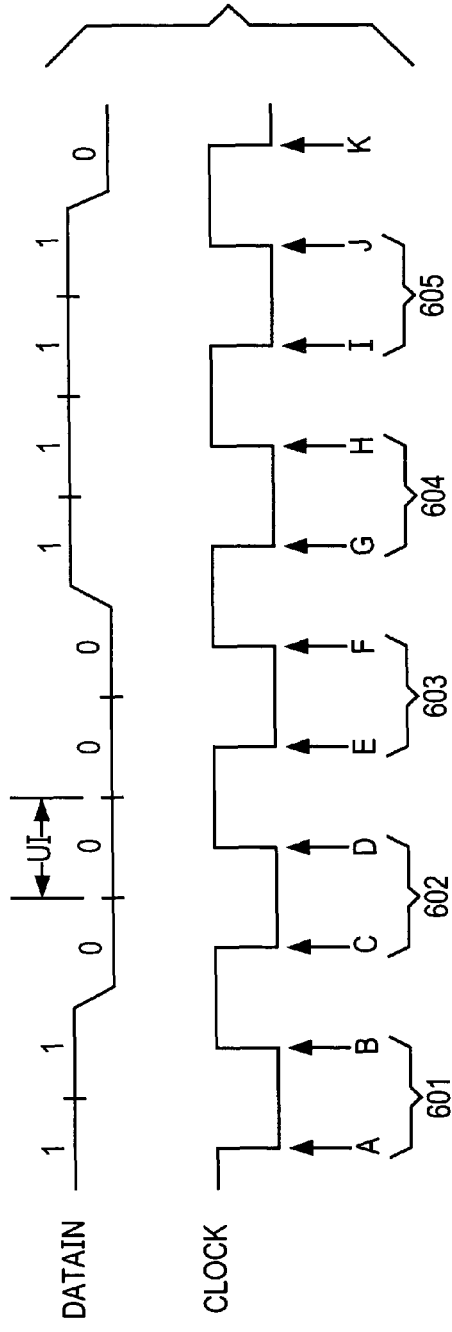
FIG. 2 show illustrative, simplified waveforms (plotted along a common horizontal time axis (increasing time to the right)) that are useful in explaining the invention.

When circuitry 500 first begins to operate (in what may be called "training mode"), flip-flop 540 is reset to 0. CLOCK is selected to be the "candidate" clock signal that has the lowest or smallest phase angle of several differently phased "candidate" clock signals. (The manner in which such differently phased clock signals can be provided is described in more detail later in this specification.) At this time the DATAIN signal is training data as described above. Flip-flops 510 and 520 begin to demultiplex successive bits in DATAIN. For ease of explanation it will be assumed that transitions in CLOCK are not too close to transitions in DATAIN at this time. The initial demultiplexing performed by flip-flops 510 and 520 may cause flip-flops 516 and 526 to both, concurrently, register is or 0s from the demultiplexed data. For example, if circuitry 500 starts operating as shown in FIG. 2, sample A is taken by flip-flop 520 when DATAIN is 1, and sample B is taken by flip-flop 510 when DATAIN is also 1. Accordingly, the subsequent outputs of flip-flops 516 and 526 are both 1, and the COMPARE output signal of XOR gate 530 is 0. This keeps the output signal of flip-flop 540 0 (AND gate 532 is enabled during this time). The next pair of samples C and D taken, respectively, by flip-flops 520 and 510 are both 0. Accordingly, the subsequent outputs of flip-flops 516 are 526 are both 0, so the COMPARE output signal of XOR gate 530 remains 0, as does the output signal of flip-flop 540. Given the relationship between DATAIN and CLOCK shown in FIG. 2, COMPARE will remain 0 at least until the phase of CLOCK changes (as a result of selection of a different candidate clock signal for CLOCK).

Figure 3:
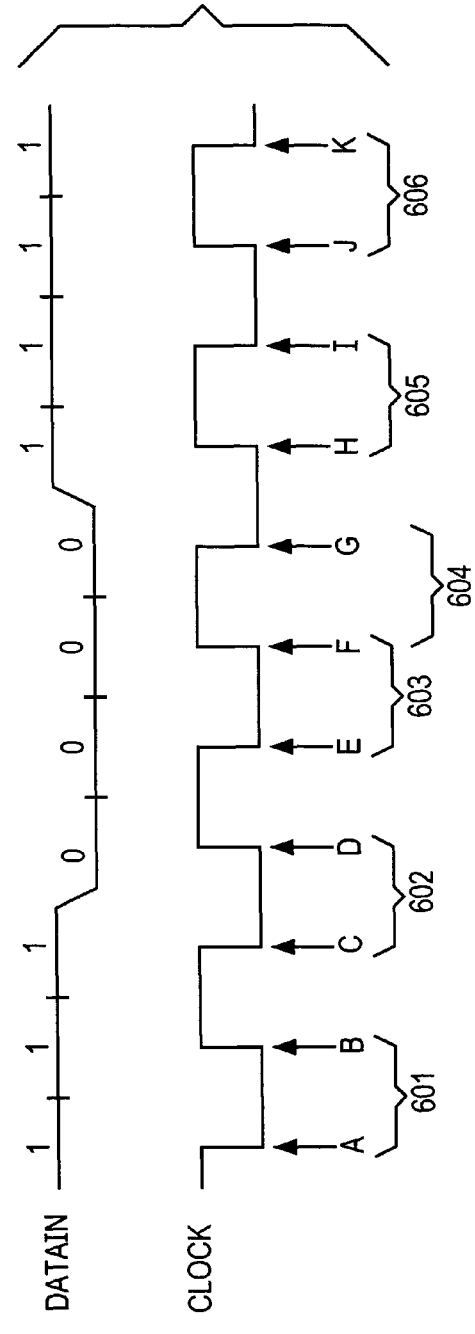
FIGS. 3-5 are similar to FIG. 2 for some other waveforms.

Another possible condition in which circuitry 500 may start up is shown in FIG. 3. In this case samples A and B are both 1 (as for samples A and B in FIG. 2), so the circuitry performs the same way as described above for samples A and B in FIG. 2. However, the next two samples (C and D) are not the same. Sample C (taken by flip-flop 520) is 1, but sample D (taken by flip-flop 510) is 0. The subsequent outputs of flip-flops 516 and 526 will therefore be different from one another, and XOR gate 530 will therefore output a compare signal of 1. This will cause flip-flop 540 to output 1, which causes flip-flop 540 to subsequently output 1. This causes multiplexer 514 to thereafter pass the output signal of flip-flop 512 (rather than the output signal of flip-flop 510). The output signal of flip-flop 512 is the output signal of flip-flop 510 delayed by one CLOCK cycle. Accordingly, whereas XOR gate 530 would have subsequently compared unequal samples G (from flip-flop 520) and H (from flip-flop 510), sample F is instead used a second time (this time from flip-flop 512) for comparison with sample G. This keeps COMPARE 0, which prevents flip-flop 540 from toggling back to 0.

The effect of the operations described in the two preceding sentences is that if the demultiplexing performed by flip-flops 510 and 520 is not initially aligned with pairs 601, 602, 603, etc. of training bits, in DATAIN that are of equal value, the first comparison of unequal samples brings flip-flop 512 into active use so that thereafter the comparisons performed by XOR gate 530 will be of equal-valued samples. FIG. 2 illustrates a case in which the pairs 601, 602, 603, etc., of samples compared by XOR gate 530 are all equal valued. FIG. 3 illustrates a case in which the pairs of samples compared by XOR gate 530 must be realigned or shifted along DATAIN so that thereafter the pairs of samples compared will be equal valued. To briefly recapitulate with regard to FIG. 3, comparison 601 is of equal samples A and B. Comparison 602 is of unequal samples C and D. After one more comparison 603 of equal samples E and F, the result of comparison 602 leads to realignment of all subsequent comparisons 604, 605, 606, etc., which are all again of equal samples (e.g., comparison 604 being of equal samples F and G, comparison 605 being of equal samples H and I, etc.)

The discussion thus far has related to achieving proper alignment of the pairs of samples of DATAIN that are compared by XOR gate 530 during each successive cycle of CLOCK. These sample pairs 601, 602, 603, 604, 605, etc. are either initially properly aligned as shown in FIG. 2, or they are not initially properly aligned and the circuitry is operated to bring them into proper alignment as shown in FIG. 3. We turn now to subsequent operation of the circuitry to locate edges (transitions) in DATAIN.

Circuitry 500 operates with each of several different candidate clock signals as CLOCK during successive periods of time. All of the candidate clock signals have the same frequency, which is half the DATAIN data rate (e.g., as shown in FIGS. 2 and 3). The candidate clock signals are used for CLOCK one after another in order of increasing phase shift or phase angle. Although the phase shift between phase-adjacent candidate clock signals does not have to be the same for all of the candidates, it will be simplest to assume that it is the same and can be referred to as D. Preferences regarding D are as follows. D should be less than UI, but is preferably a significant fraction of UI so that N×D is at least equal to UI, where N is the number of available phase-shifted candidate clock signals. Circuitry 500 is preferably operated using each progressively more phase-shifted candidate clock signal as CLOCK for a period of time sufficient for at least a few repetitions of the training data pattern to have occurred while each candidate clock signal is in use. For example, if the training data is M 0s alternating with M 1s, one iteration of the training data pattern is M 0s preceded or followed by M 1s. After circuitry 500 has been operated using each candidate clock signal for the prescribed period of time (i.e., several iterations of the training pattern), the circuitry switches to using the next candidate clock signal having the next greater phase shift or phase angle.

Figure 4:
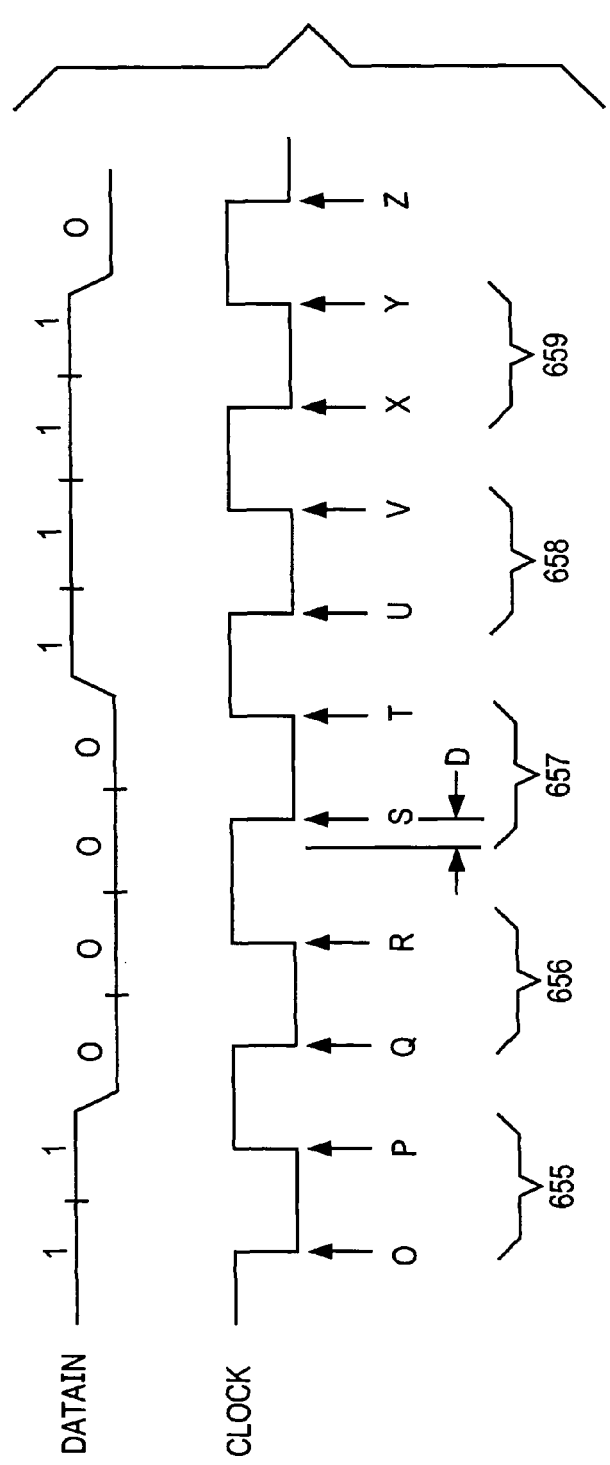

FIG. 4 shows an example of the operation of circuitry 500 during an illustrative change in the phase of CLOCK as described toward the end of the preceding paragraph. Circuitry 500 operates with CLOCK having a first phase through the taking of sample R. (The sample reference letters O, P, Q, R, etc., in FIG. 4 are entirely arbitrary, as are the reference numbers 655, 656, 657, etc., for the pairs of samples that are compared by XOR gate 530 during successive CLOCK cycles.) After sample R has been taken, the phase of CLOCK is increased by D as a result of switching from one candidate clock signal to the candidate clock signal with the next larger phase angle. Sample S is therefore somewhat later than it otherwise would have been. However, in this example sample S is still taken well within the next unit interval immediately following the unit interval in which sample R was taken. In other words, sample S is not near or in an edge or transition between unit intervals, nor is any unit interval skipped. Sampling continues using this newly-phased CLOCK with no other change in the operation of circuitry 500. Because this new CLOCK phase places samples sufficiently far from edges in DATAIN, use of this phase does not cause COMPARE to ever deviate from 0. Circuitry 500 will therefore continue to use and ultimately complete its use of this new CLOCK without ever producing a COMPARE that is 1.

Figure 5:
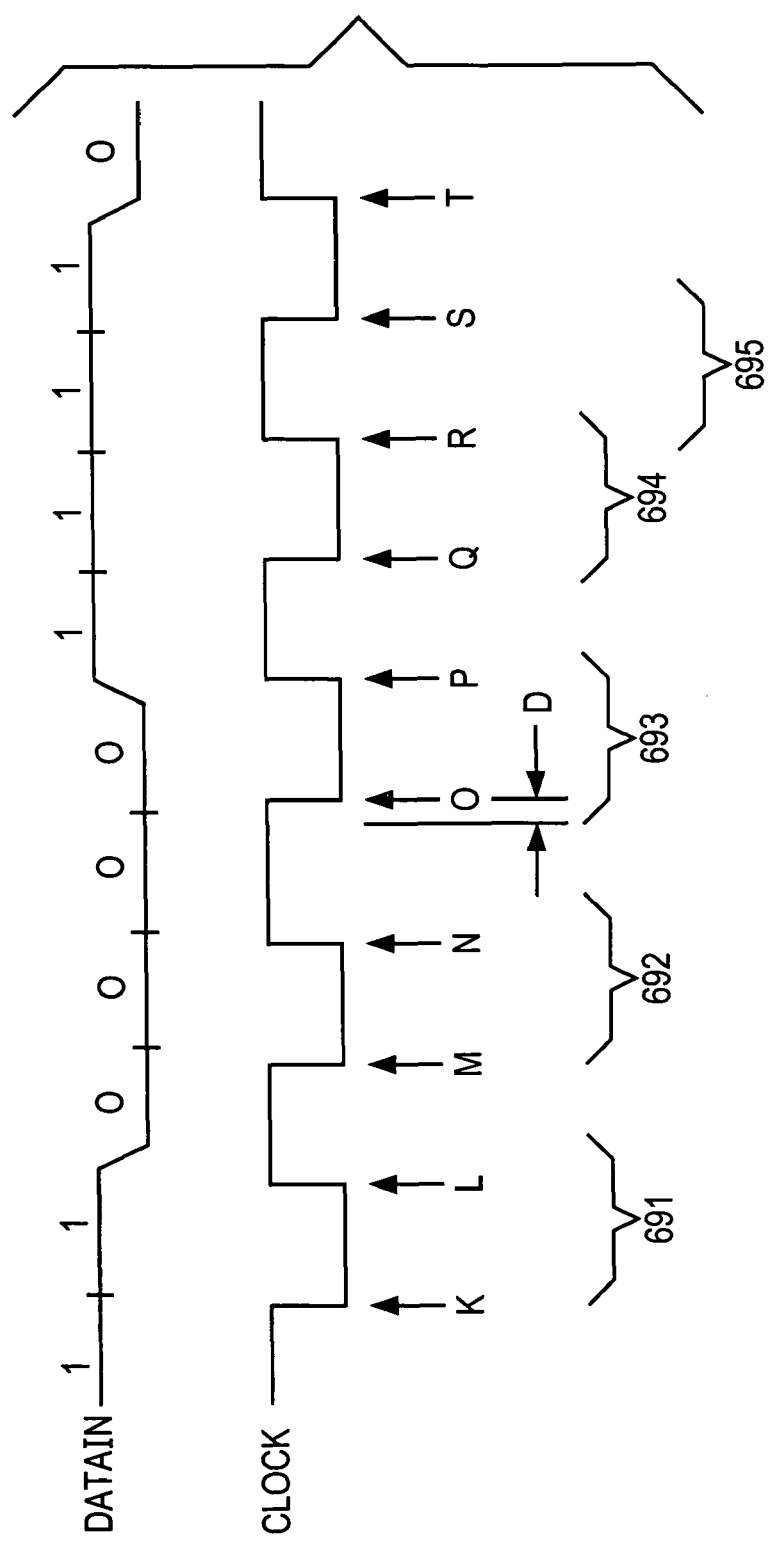

Circuitry 500 continues to operate with CLOCK having progressively greater phase until a condition like that illustrated by FIG. 5 is reached. After sample N is taken, the phase of CLOCK is again incremented by D. This causes sample O to be taken after the UI following the UI in which sample N was taken. In other words, the UI following the UI in which sample N was taken goes unsampled and is therefore skipped or missed. Sample P is taken after DATAIN has transitioned from 0 to 1. Accordingly, the comparison 693 of samples O and P that is subsequently performed by XOR gate 530 causes COMPARE to switch from 0 to 1. This happens because the pair 693 of samples O and P are no longer properly aligned with an equal-valued pair of bits in DATAIN. This is the result of the bit between samples N and O having been skipped. The switching of COMPARE from 0 to 1 due to comparison 693 causes toggling in the use of flip-flop 512. If flip-flop 512 was not in use for the data compared in comparison 693, then flip-flop 512 is switched into use via control of multiplexer 514 for use for the data that will be compared in comparison 695 and subsequently. Conversely, if flip-flop 512 was in use for the data compared in comparison 693, then flip-flop 512 is switched out of use for the data that will be compared in subsequent comparisons like 695. In other words, this toggling of flip-flop 512 into use or out of use realigns the comparisons like 695 with equal-valued bit pairs in the DATAIN training data. The fact that this new phase for CLOCK caused COMPARE to become 1 for some comparison (i.e., comparison 693) is recorded with reference to the candidate clock phase that caused a 1 in COMPARE. The occurrence of this 1 in COMPARE is significant because it indicates that this candidate clock signal has transitions that are close to the edges or transitions in DATAIN.

After all of the candidate clock signals have been used in turn for CLOCK, the accumulated data about which of those candidate clocks caused one or more is in COMPARE can be used to determine which of the candidate clock signals it will be best to select for CLOCK for use in sampling the "real" data in DATAIN that follows the training data. For example, it is typically desired to select a candidate clock having transitions that are as far as possible from transitions in DATAIN (i.e., a candidate clock having transition that are as close as possible to the centers of the UIs in DATAIN). As an illustration of this, if 16 candidate clocks having equal phase spacing were used, and if the occurrences of 1 in COMPARE were as shown in FIG. 6, then candidate clock signal 8 (half way between candidate clock signals 4 and 12) would be a good choice for CLOCK when real DATAIN data is to be processed. From the information collected as shown in FIG. 6, it will be apparent that transitions in candidate clock signal 8 should be as far as possible from transitions in DATAIN. Use of candidate 8 for CLOCK should therefore give the most reliable sampling of DATAIN.

If circuitry 500 continues to be used for capturing real DATAIN data following the training data, it can be necessary to make sure that circuitry 500 is demultiplexing the real data with the proper phase. For example, if the circuitry downstream from circuitry 500 expects to receive the first bit of real data on the DATA1OUT lead (FIG. 1), the second bit of real data on the DATA2OUT lead, the third bit on DATA1OUT, the fourth bit on DATA2OUT, and so on, then a decision needs to be made regarding whether or not flip-flop 512 should be in effective use in circuitry 500 during the demultiplexing of real data. Also, a related decision needs to be made as to which of flip-flops 510 and 520 DATA1OUT and DATA2OUT should be derived from. If CLOCK has a falling edge when the first bit of real data is on DATAIN, then flip-flop 512 does not need to be used. Also, DATA1OUT can be derived from flip-flop 520 and DATA2OUT can be derived from flip-flop 510. The data will be properly demultiplexed. These choices can be effected by having the output of flip-flop 540 be 0. This causes multiplexer 514 to bypass flip-flop 512, it causes multiplexer 518 to get DATA2OUT from the circuit path that includes flip-flop 510, and it causes multiplexer 528 to get DATA1OUT from the circuit path that includes flip-flop 520.

On the other hand, if CLOCK has a rising edge when the first bit of real data arrives, flip-flop 512 must be put into use, DATA1OUT must be derived from the channel including flip-flop 510, and DATA2OUT must be derived from the channel including flip-flop 520 in order for the data to be properly demultiplexed. Circuitry 500 can be controlled to make these choices by making the output signal of flip-flop 540 1.

Flip-flop 540 can be placed in the proper state for handling real data as described in the two preceding paragraphs in the following manner. After a final choice for CLOCK has been made and implemented, training data continues to be supplied for some time. If all samples of this training data that are compared by XOR gate 530 are equal-valued, then the state of flip-flop 540 is correct. This can be either the 0 or the 1 state of flip-flop 540. The choices controlled by that flip-flop output state (i.e., the choices made by multiplexers 514, 518, and 528 will be the correct ones for properly demultiplexing real data when it begins to arrive following orderly and controlled completion of the training data. On the other hand, if XOR gate 530 makes a comparison of samples that are not equal-valued, then the resulting 1 output from XOR gate 530 toggles the state of flip-flop 540. This changes the choices controlled by the output of that flip-flop and makes those choices the correct ones for properly demultiplexing the real data that follows the orderly and controlled completion of the training data. After this phase of the operation of circuitry 500, the state of flip-flop 540 can be effectively locked (e.g., by deasserting the ENABLE input to AND gate 532). This prevents any further changes in state of flip-flop 540 in response to the subsequent real data, which may, of course, have 1s and 0s in any order.

It will be appreciated that the foregoing discussion is somewhat simplified. For example, successive candidate clock signals may not cleanly avoid or skip over all transitions in training DATAIN. A candidate clock signal may cause transitions in CLOCK to be sufficiently close to transitions in training DATAIN that COMPARE is 1 several or many times during use of that candidate. This will cause corresponding repeated toggling of flip-flop 540. But the principles described above remain the same. Any candidate clock that causes COMPARE to be 1, whether once or several times, is probably not a good candidate for final selection as the CLOCK for sampling real data. (The sole exception to this is that a 1 in COMPARE relatively early in use of the first candidate clock can probably be ignored as only attributable to initially aligning the operation of circuitry 500 with equal-valued pairs of bits in the training data. FIG. 3 illustrates this point.) Another possible simplification in the foregoing discussion is the assumption in FIG. 6 that only isolated, single candidate clocks cause COMPARE to be 1. In fact, several phase-adjacent candidate clocks may cause COMPARE to be 1. Then several more phase-adjacent candidates may allow COMPARE to remain 0. Then several more phase-adjacent candidates may cause 1s in COMPARE, and so on. Under such conditions, it may be desirable to find the approximate center or average of each cluster of candidates causing 1s in COMPARE, and to select a candidate that is midway between the centers or averages of two such clusters for use as the final CLOCK.

Figure 7:
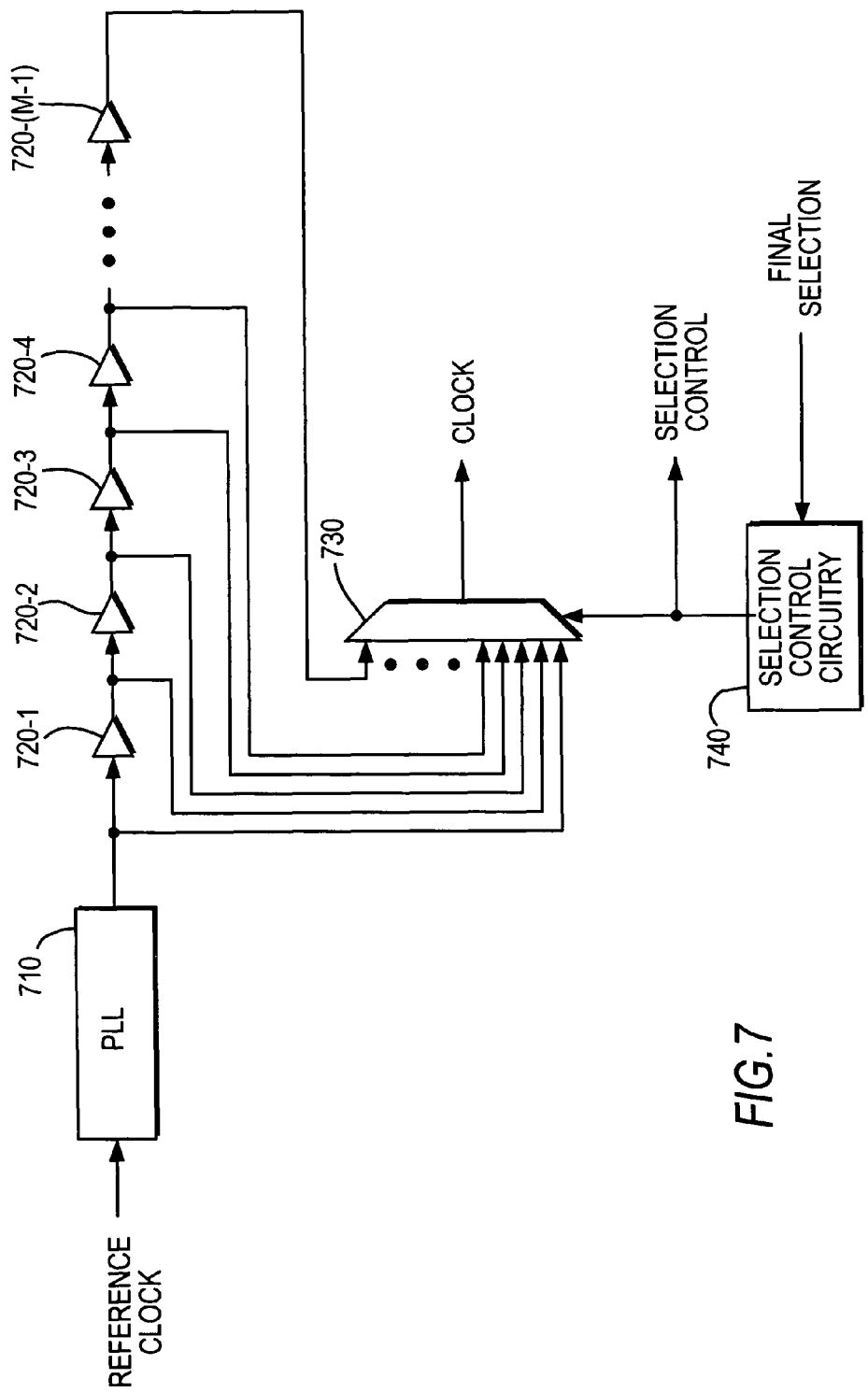
FIG. 7 is a simplified schematic block diagram of an illustrative embodiment of more circuitry in accordance with the invention.
Figure 8:
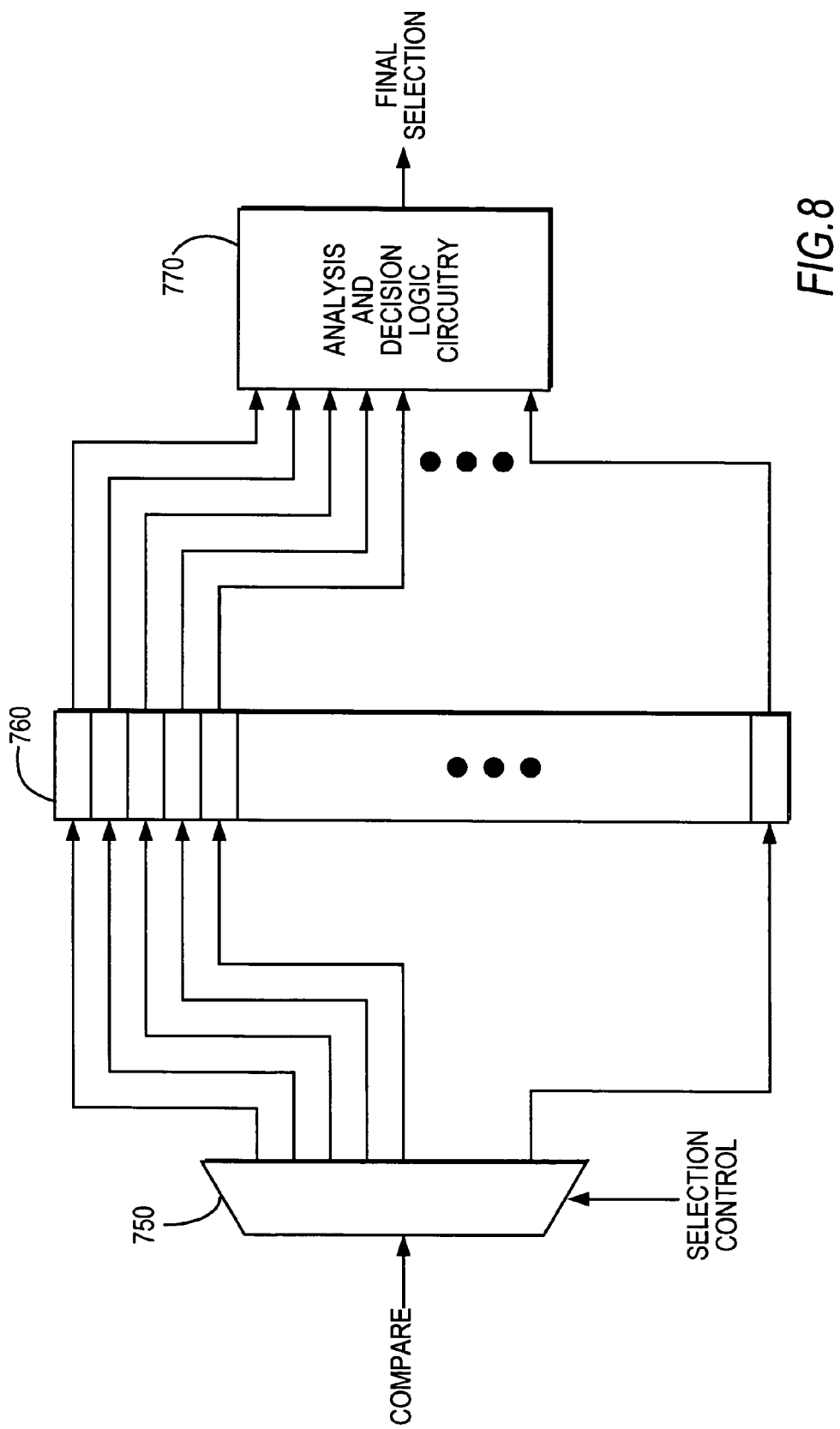
FIG. 8 is a simplified schematic block diagram of an illustrative embodiment of still more circuitry in accordance with the invention.

For completeness, illustrative circuitry for providing and selecting among several candidate clock signals is shown in FIGS. 7 and 8. In FIG. 7 phase locked loop ("PLL") circuitry 710 receives a REFERENCE CLOCK signal having frequency that is half the rate of data in DATAIN. PLL 710 produces a similar but highly stable output signal, which is a first of the candidate clock signals. This signal is applied to one input terminal of multiplexer circuitry 730, and also to the input terminal of delay circuit element 720-1. Delay circuit element 720-1 delays the signal it receives by the amount required to give its output a phase shift D relative to its input. The output signal of delay circuit element 720-1 is a second of the candidate clock signals. It is applied to another input terminal of multiplexer circuitry 730, and also to the input terminal of delay circuit element 720-2. Delay circuit element 720-2 delays the signal it receives by the same amount that delay circuit element 720-1 delays its input signal. Accordingly, the output signal of element 720-2 is another candidate clock signal with a further phase shift D. This circuit arrangement continues so that M phase-distributed candidate clock signals are produced and applied to respective inputs to multiplexer 730. The phase difference between any two phase-adjacent ones of these candidates is D.

Selection control circuitry 740 is initially operated to control multiplexer 730 to select the candidate clock signals one after another in order of increasing phase. The currently selected candidate becomes the CLOCK signal (FIG. 1). Although not shown in FIG. 7, circuitry 740 may monitor the CLOCK signal so that each change in candidate selection is synchronized with the current CLOCK signal. The SELECTION CONTROL output signals of circuitry 740 are also the selection control inputs to demultiplexer 750 in FIG. 8. The data input to demultiplexer 750 is COMPARE (FIG. 1). Demultiplexer 750 accordingly operates to route COMPARE to the one of several storage locations in circuitry 760 that is associated with the candidate clock signal currently selected for CLOCK. Each of the storage locations in circuitry 760 may be initially set to 0 and switch to and remain 1 if a COMPARE value of 1 is routed to it. Accordingly, after all of the candidate clock signals have been used, the contents of the various location in circuitry 760 indicate which candidates caused a 1 (or several 1s) in COMPARE. Circuitry 770 then analyzes the contents of circuitry 760 in order to make a final selection of the best candidate for use during subsequent capture of real data. The FINAL SELECTION output signals of circuitry 770 are fed back to circuitry 740 (FIG. 7) so that it can control multiplexer 730 to make the corresponding final selection of CLOCK.

It will be understood that the foregoing is only illustrative of the principles of the invention, and that various modifications can be made by those skilled in the art without departing from the scope and spirit of the invention. For example, each of the various locations in circuitry 760 could be a counter for counting the occurrences of 1 in the COMPARE signal directed to that location. Circuitry 770 could then use the magnitudes of these various counts to help determine the best candidate clock for subsequent use in capturing real data. As another example of a possible modification, it might be preferred to select the final CLOCK so that its transitions are somewhat ahead of the center of each UI in DATAIN, or somewhat behind the center of each UI. Circuitry 770 can implement any desired decision criteria.

What is claimed is:

1. A method of detecting phase of transitions in a serial data signal comprising:
    using a clock signal to time the capturing of samples of the serial data signal at the rate of one sample per data bit in the serial data signal;
    periodically incrementing phase of the clock signal by an amount that is less than the duration of a bit in the serial data signal so that a plurality of different phases of the clock signal are used one after another, at least one occurrence of the incrementing causing one bit in the serial data signal to be unsampled in the capturing of the samples;
    identifying any particular phase of the clock signal that causes successive ones of the samples to have a relationship to one another that is abnormal for successive bits in the serial data signal as a result of the incrementing to said particular phase of the clock signal causing one bit in the serial data signal to be unsampled in the capturing of the samples, and as a result of the identifying, thereby detecting the phase of transitions in the serial data signal;
    selecting a phase of the clock signal that is not identified in the identifying for use in sampling the serial data signal after the phase of transitions in the serial data signal has been detected;
    causing the serial data signal to conform to a predetermined training data pattern during the using, the periodically incrementing, and the identifying; and after the selecting:
    following the training data pattern in the serial data signal with data that is not predetermined.

2. The method defined in claim 1 wherein a sum of the amounts of phase increments in all of the incrementings is at least equal to the duration of a bit in the serial data signal.

3. The method defined in claim 1 wherein the identifying comprises:
    comparing to one another two samples in each of a plurality of successive pairs of successive ones of the samples to determine whether said two samples have equal value.

4. The method defined in claim 3 wherein the comparing comprises:
    aligning the successive pairs of samples with successive pairs of bits in the serial data signal that have a predetermined relationship to one another.

5. The method defined in claim 4 wherein the comparing further comprises:
    realigning the successive pairs of samples with successive pairs of bits in the serial data signal whenever the samples compared in the comparing do not have the predetermined relationship to one another.

6. The method defined in claim 1 wherein the identifying identifies two phases that are separated from one another by other phases that were not identified in the identifying, and wherein the selecting comprises choosing one of the other phases.

7. The method defined in claim 6 wherein the one of the other phases chosen in the choosing is the phase closest to midway between the two phases identified in the identifying.

8. Circuitry for detecting phase of edges in a serial data signal while that signal conforms to a predetermined training data pattern comprising:
  double data rate ("DDR") circuitry for normally capturing samples of two successive bits in each of a plurality of successive pairs of bits in the serial data signal, the DDR circuitry operating to capture the samples in synchronism with a clock signal;
  circuitry for causing the clock signal to change in phase in a plurality of successive increments that are each individually less than duration of a bit in the serial data signal, the circuitry for causing operating independently of and not based on any results of sampling the serial data signal, at least one said change in phase causing one bit in the serial data signal to be unsampled by the DDR circuitry;
  circuitry for detecting any phase of the clock signal that causes two successive samples captured by the DDR circuitry to not have a normal relationship to one another while the serial data signal conforms to the predetermined training pattern; and
  circuitry for shifting the pairs along the data signal when two successive samples captured by the DDR circuitry do not have the normal relationship to one another.

9. The circuitry defined in claim 8 wherein the DDR circuitry comprises:
  first circuitry for sampling the serial data signal in synchronism with rising edges in the clock signal; and
  second circuitry for sampling the serial data signal in synchronism with falling edges in the clock signal.

10. The circuitry defined in claim 9 wherein the DDR circuitry further comprises:
  circuitry for selectively delaying each sample produced by the first circuitry by a cycle of the clock signal.

11. The circuitry defined in claim 8 wherein the circuitry for causing comprises:
  a source of a reference clock signal; and
  a plurality of delay circuits through which the reference clock signal is passed in series so that outputs of the delay circuits are versions of the reference clock signal with progressively greater phase.

12. The circuitry defined in claim 11 wherein the circuitry for causing further comprises:
  circuitry for selecting for use as the clock signal outputs of the delay circuits one after another in order of increasing phase.

13. The circuitry defined in claim 8 wherein the increments are collectively at least equal to the duration of a bit in the serial data signal.

14. The circuitry defined in claim 8 wherein the circuitry for detecting comprises:
  circuitry for comparing values of each two successive samples.

15. The circuitry defined in claim 14 wherein the circuitry for comparing produces an output signal indicative of whether the values compared have a relationship that would be expected for samples from two bits in one of the pairs.

16. The circuitry defined in claim 15 wherein the circuitry for shifting shifts the pairs along the serial data signal in response to an output signal from the circuitry for comparing that indicates that the values compared do not have the relationship expected for samples from two bits in one of the pairs.

17. A method of detecting phase of edges in a serial data signal comprising:
  providing a plurality of phase-distributed candidate clock signals, each of which has frequency half the rate of data in the serial data signal, and each of which has phase greater than a phase-adjacent preceding one of the candidates in the plurality, the phase difference between each candidate and the phase-adjacent preceding one of the candidates being the same for all of the candidates and less than the duration of a bit in the serial data signal;
  selecting the candidates one after another in order of increasing phase for use as a trial clock signal, each of the candidates being selected for use for a period time sufficient for a plurality of bits to have occurred in the serial data signal before a next one of the candidates is selected for use;
  using transitions in the trial clock signal to time the taking of samples of the serial data signal while the serial data signal is composed of training data that includes even numbers of 1s alternating with even numbers of 0s, the samples being taken at the rate of one sample per bit in the serial data signal, the selecting of at least one of the candidates causing one bit in the serial data signal to be unsampled as the trial clock signal changes to a particular candidate from the phase-adjacent preceding one of the candidates;
  comparing the samples in successive pairs of the samples to detect whether or not they are equal-valued;
  shifting the successive pairs of the samples along the serial data signal whenever the comparing detects an unequal-valued pair as a result of the selecting causing one bit in the serial data signal to be unsampled; and
  flagging the candidate clock signals that cause the comparing to detect the unequal-valued pairs.

\* \* \* \* \*